United States Patent
Sun et al.

(10) Patent No.: US 9,105,342 B2
(45) Date of Patent: Aug. 11, 2015

(54) READ CIRCUIT FOR MEMORY

(71) Applicants: International Business Machines Corporation, Armonk, NY (US); Headway Technologies, Inc., Milipitas, CA (US)

(72) Inventors: Jonathan Z. Sun, Shrub Oak, NY (US); John K. DeBrosse, Colchester, VT (US); Po-Kang Wang, Los Altos, CA (US)

(73) Assignees: International Business Machines Corporation, Armonk, NY (US); Headway Technologies, Inc., Milipitas, CA (US)

( * ) Notice: Subject to any disclaimer, the term of this patent is extended or adjusted under 35 U.S.C. 154(b) by 172 days.

(21) Appl. No.: 13/755,853

(22) Filed: Jan. 31, 2013

(65) Prior Publication Data

US 2014/0211550 A1    Jul. 31, 2014

(51) Int. Cl.
G11C 11/16 (2006.01)
G11C 29/04 (2006.01)

(52) U.S. Cl.
CPC ........... *G11C 11/1673* (2013.01); *G11C 11/16* (2013.01); *G11C 2029/0411* (2013.01)

(58) Field of Classification Search
CPC ........ G11C 11/16; G11C 11/15; G11C 11/14; H01L 27/228; H01L 43/08
USPC .......................................................... 365/171
See application file for complete search history.

(56) References Cited

U.S. PATENT DOCUMENTS

| | | | |
|---|---|---|---|
| 6,898,106 B2 | 5/2005 | Hoenigschmid et al. | |
| 7,852,660 B2 | 12/2010 | Zhu et al. | |
| 8,199,562 B2 | 6/2012 | Zhu et al. | |
| 2010/0039136 A1 | 2/2010 | Chua-Eoan et al. | |
| 2011/0058406 A1 | 3/2011 | Ma et al. | |
| 2011/0157971 A1 | 6/2011 | Kim et al. | |
| 2012/0014166 A1 | 1/2012 | Ma et al. | |
| 2012/0044754 A1* | 2/2012 | DeBrosse et al. | 365/171 |
| 2012/0057400 A1 | 3/2012 | Kim et al. | |

OTHER PUBLICATIONS

D. Halupka, et al.; "Negative-Resistance Read and Write Schemes for STT-MRAM in 0.13 μm CMOS"; IEEE ISSCC 2010, Session 14, Non-Volatile Memory, 14.1;pp. 256-258; 2010.
H. Koike, et al.; "A New Sensing Scheme with High Signal Margin Suitable for Spin-Transfer Torque RAM"; IEEE; p. 1-2; 2011.
J. Kim, et al.; "A Novel Sensing Circuit for Deep Submicron Spin Transfer Torque MRAM (STT-MRAM)"; IEEE Transactions on Very Lar Scale Integration (VLSI) Systems; vol. 20, No. 1; pp. 181-186; Jan. 2012.

(Continued)

*Primary Examiner* — Jason Lappas
(74) *Attorney, Agent, or Firm* — Cantor Colburn LLP; Vazken Alexanian

(57) ABSTRACT

Embodiments are directed to detecting a state of a memory element in a memory device, comprising: applying a pulse of a predetermined magnitude and duration to the memory element to induce a transition in the state of the memory element when a polarity of the pulse is opposite to the state, monitoring, by a device, a signal associated with the memory element to detect a presence or absence of a transition in the signal in an amount greater than a threshold, and determining the state of the memory element based on said monitoring.

11 Claims, 8 Drawing Sheets

(56) References Cited

OTHER PUBLICATIONS

J. Sun; "A Feasibility of an Active-Read Circuit Concept for Spin-Torque Switched Magnetic Tunnel Devices in Random Access Memory"; IBM-TDK MRAM Development Alliance; p. 1-10; Oct. 21, 2011.

N. Mojumder, et al.; "Magnonic Spin-Transfer Torque MRAM With Low Power, High Speed, and Error-Free Switching"; IEEE Transaction on Magnetics; vol. 48, No. 6; p. 2016-2024; Jun. 2012.

Y. Chen, et al., "A 130 nm 1.2 V/3.3 V 16 Kb Spin-Transfer Torque Random Access Memory with Nondestructive Self-Reference Sensing Scheme"; IEEE Journal of Solid-State Circuits; vol. 47, No. 2; p. 560-573; Feb. 2012.

* cited by examiner

READ CIRCUIT FOR MEMORY

FIELD OF INVENTION

The present invention relates generally to computer memory technology, and more specifically, to detection of a state of a memory cell or memory element.

DESCRIPTION OF RELATED ART

In the context of computer memory devices, such as spin-transfer torque (STT) magnetic random access memory (MRAM), magnetoresistance of magnetic tunnel junctions (MTJs) forming a memory element may determine the magnitude of a signal needed for logic state (e.g., '0' or '1') discrimination. Based on decreasing sizes of memory devices, as well as variations in process and fabrication techniques, margins (e.g., logic state margins) are shrinking/eroding, making it more difficult to read data reliably.

It is often desirable to use a low write threshold voltage when writing a memory device. However, the use of a low write threshold voltage may cause the memory device's logic state to be disturbed by electrical bias during a read operation.

BRIEF SUMMARY

Embodiments are directed to a method for detecting a state of a memory element in a memory device, comprising: applying a pulse of a predetermined magnitude and duration to the memory element to induce a transition in the state of the memory element when a polarity of the pulse is opposite to the state, monitoring, by a device, a signal associated with the memory element to detect a presence or absence of a transition in the signal in an amount greater than a threshold, and determining the state of the memory element based on said monitoring.

Embodiments are directed to a non-transitory computer program product comprising a computer readable storage medium having computer readable program code stored thereon that, when executed by a computer, performs a method for detecting a state of a memory element in a memory device, the method comprising: applying a pulse of a predetermined magnitude and duration to the memory element to induce a transition in the state of the memory element when a polarity of the pulse is opposite to the state, monitoring a signal associated with the memory element to detect a presence or absence of a transition in the signal in an amount greater than a threshold, and determining the state of the memory element based on said monitoring.

Embodiments are directed to a system for detecting a state of a memory element in a memory device comprising: a source configured to generate and apply a pulse of a predetermined magnitude and duration to the memory element to induce a transition in the state of the memory element when a polarity of the pulse is opposite to the state, a device configured to monitor a signal associated with the memory element to detect a presence or absence of a transition in the signal in an amount greater than a threshold, and the device is configured to determine the state of the memory element based on the monitoring of the signal.

Additional features and advantages are realized through the techniques described herein. Other embodiments and aspects are described in detail herein. For a better understanding, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other features and advantages are apparent from the following detailed description taken in conjunction with the accompanying drawings in which:

DETAILED DESCRIPTION

Figure 1:
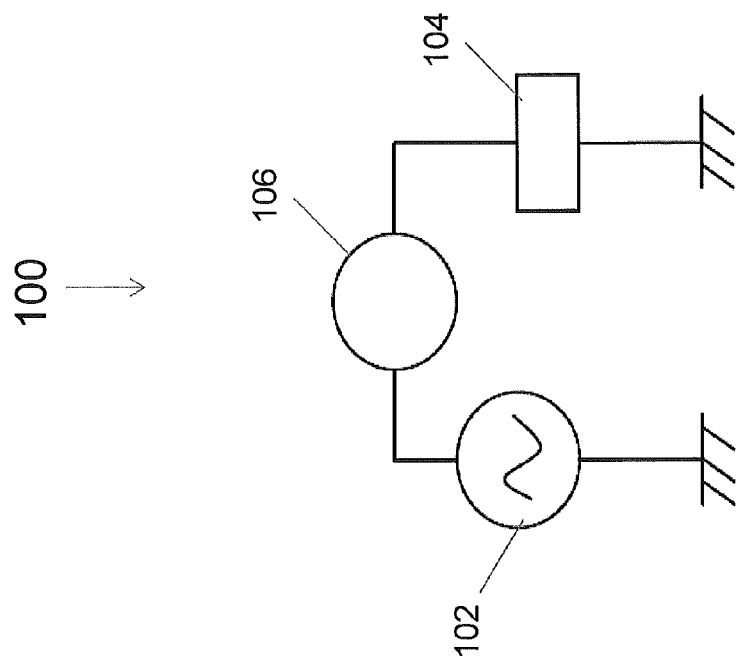
FIG. 1 is a schematic diagram illustrating an exemplary circuit.

In some embodiments, a state of an element or cell in a memory device may be detected. The detection of the state may be based on an injection of a pulse of a sufficient magnitude and duration. The detection of the state may be based on monitoring for the presence or absence of a transition, switching event, or condition based on having injected the pulse.

It is noted that various connections are set forth between elements in the following description and in the drawings (the contents of which are included herein by way of reference). It is noted that these connections in general and, unless specified otherwise, may be direct or indirect and that this specification is not intended to be limiting in this respect. In this regard, a coupling of entities may refer to either a direct or an indirect connection.

Referring to FIG. 1, an exemplary circuit 100 is shown. The circuit 100 is shown as including a source 102, a magnetic tunnel junction (MTJ) 104, and a monitor or sensor 106. The MTJ 104 may be indicative of one or more components that form a memory element of a memory device.

In order to determine or detect a state associated with, or stored at, the MTJ 104, the source 102 may be configured to apply a pulse to the MTJ 104, and the sensor 106 may be configured to detect a presence or absence of a transition in one or more monitored signals as described further below. In some embodiments, the sensor 106 may include a differentiator configured to detect the present or absence of the transition. In some embodiments, the sensor 106 may include an ammeter or a voltmeter. Additional details regarding the sensor 106 in accordance with one or more embodiments are provided below.

In some embodiments, the source 102 may be configured to generate a pulsed voltage signal, and the sensor 106 may be configured to detect the presence or absence of a transition in terms of current flowing through the MTJ 104. In some embodiments, the source 102 may be configured to generate a pulsed current signal, and the sensor 106 may be configured to detect the presence or absence of a transition in terms of a voltage across the MTJ 104.

Figure 2:
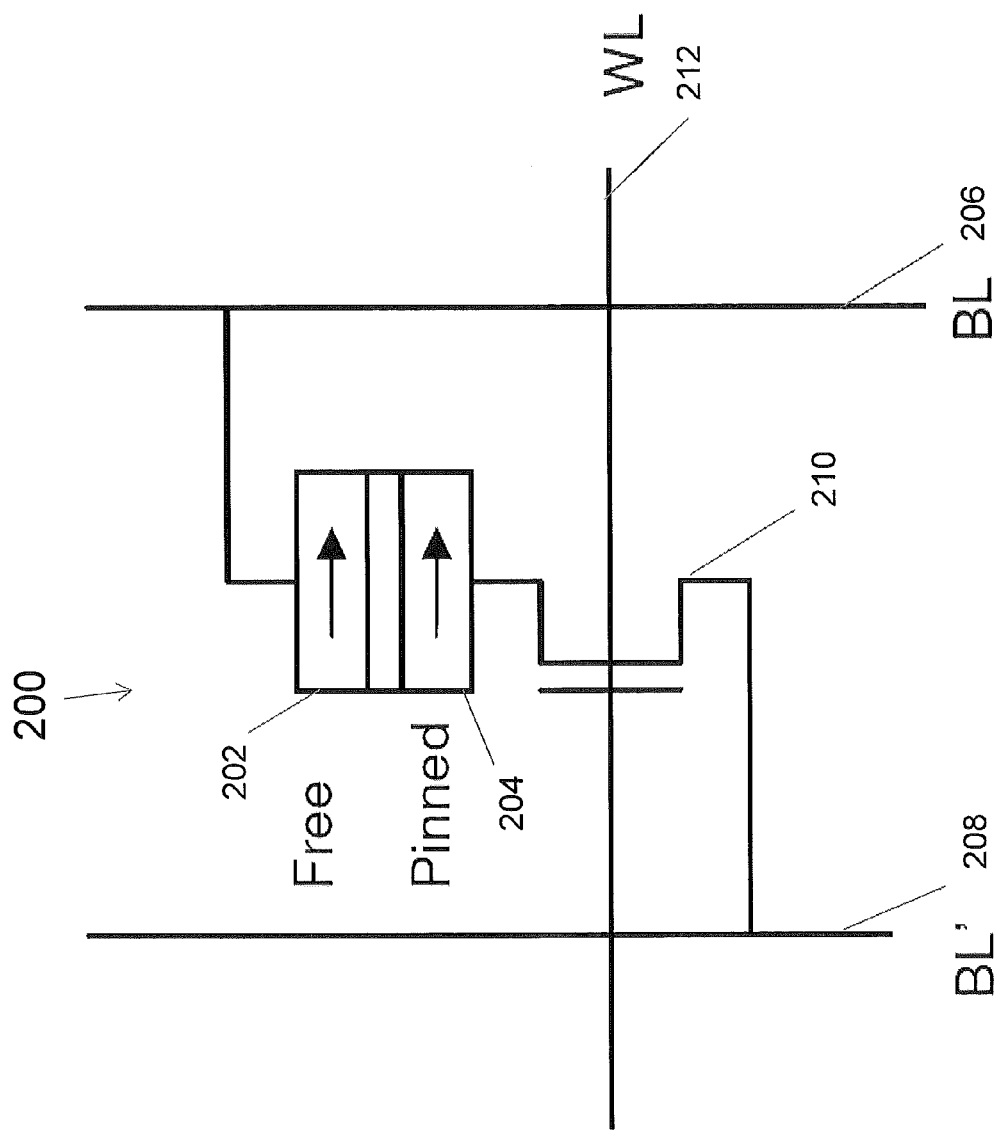
FIG. 2 is a schematic diagram illustrating an exemplary memory cell.

Turning now to FIG. 2, an exemplary MTJ cell 200 is shown. In some embodiments, the MTJ 200 may correspond to, or include, the MTJ 104 of FIG. 1. The MTJ 200 may be associated with a memory device, such as a spin-transfer torque (STT) magnetic random access memory (MRAM).

Information may be stored in the MTJ 200 as a direction of a free layer magnetization 202 being either parallel or anti-parallel to a direction of a pinned layer magnetization 204. In the example of FIG. 2, the direction of the free layer magnetization 202 is shown as being parallel to the direction of the pinned layer magnetization 204.

The MTJ 200 may be connected (e.g., electrically connected) to one or more bit lines, such as bit lines BL 206 and BL' 208, through an access transistor 210. The transistor 210 may be controlled by a control or word line, such as a word line (WL) 212. When the WL 212 is selected, the transistor 210 may be turned on or enabled. A voltage may be applied to BL 206 and BL' 208, which may result in an applied voltage across the MTJ 200. When the voltage is higher than a certain switching threshold, the state of the MTJ 200 may be switched either from a parallel state to an anti-parallel state, or from an anti-parallel to a parallel state. The direction of the switch may be determined by the polarity of the voltage.

To read the state of the MTJ 200, a different voltage may be applied across the MTJ 200, and a current through the MTJ 200 may be measured. To avoid switching the MTJ 200 during reading, the applied voltage across the MTJ 200 during a read operation may be substantially lower than the switching threshold. However, application of too low of a voltage during a read operation may result in a small signal level and thus slow speed.

Figure 3:
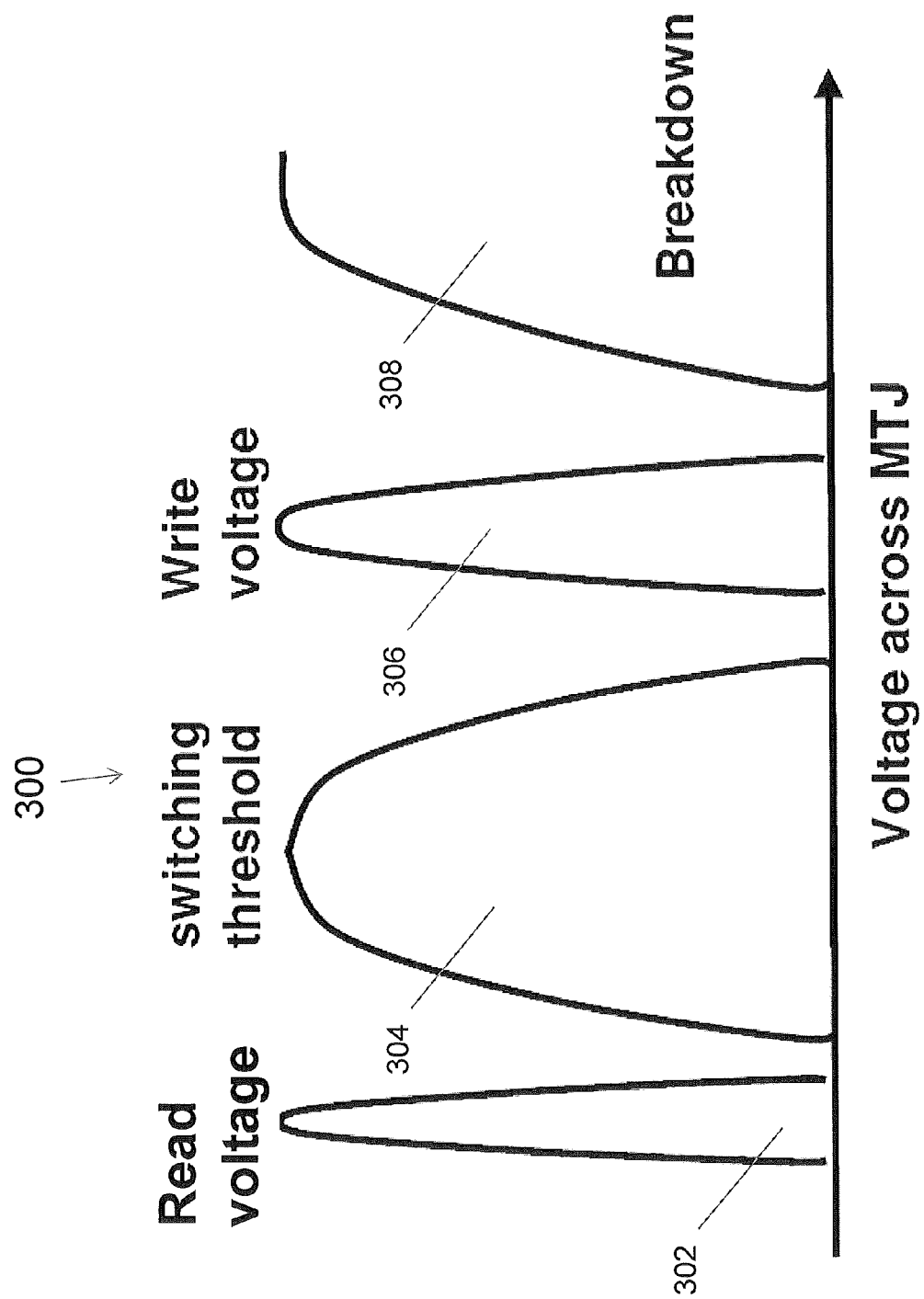
FIG. 3 is a graph illustrating an exemplary voltage distribution.

Turning now to FIG. 3, an exemplary distribution 300 of voltages across an MTJ (e.g., MTJ 104 and/or MTJ 200) is shown. The voltages may be categorized or classified into one or more groups or regions. A first region 302 may be indicative of a voltage to be applied to (reliably) read the MTJ or memory cell. A second region 304 may be indicative of a switching region or threshold in which the state of the MTJ or memory cell may change. A third region 306 may be indicative of a voltage to be applied to (reliably) write the MTJ or memory cell. A fourth region 308 may be indicative of an applied voltage that may cause a breakdown of the MTJ or memory cell. Such breakdown may be associated with damage to an oxide barrier associated with an MTJ.

Due to the MTJ-to-MTJ variations in an array, a distribution in the switching threshold 304 may be expected. Even for a single MTJ, the switching process at a finite temperature may be statistical in nature, and may be described as a distribution in a temporal sense. To reliably write all the bits all the time, the write voltage 306 may be required to be greater than the overall switching threshold distribution 304, in terms of both spatial and temporal distributions. The write voltage 306 across an MTJ might not be a very well controlled parameter due to a voltage divider effect for a typical cell configuration, like the configuration shown in FIG. 2. A combination of MTJ resistance variations, as well as other circuit parameters, may mean that the write voltage 306 has a finite distribution. Similarly, read voltage 302 may need to be lower than the overall switching threshold distribution 304. Obtaining both a low write voltage 306 to avoid damaging the MTJ oxide barrier and a higher read voltage 302 to have high read speed may pose challenges in terms of the read voltage 302 and/or the write voltage 306 approaching the switching threshold 304, resulting in reduced margin.

Another challenge may be associated with MTJ resistance variation. To reduce write current, it may be desirable to reduce the size of an MTJ. In general, the write current may be roughly proportional to an area of an MTJ barrier. However, as the MTJ gets smaller, the MTJ resistance variation may become larger. The MTJ resistance variation generally may be inversely proportional to the dimension of the MTJ, or more precisely, inversely proportional to the square root of the MTJ area. In a conventional read scheme, reading the state of MTJ may involve comparing the MTJ resistance with a reference. As the MTJ resistance becomes too large, such a read scheme might no longer be viable.

Embodiments may be used to address the foregoing challenges and/or problems associated with read-disturbance and poor read margin. In some embodiments, a read operation may be similar to a write operation, with the exception that a polarity (e.g., a voltage polarity) may be fixed.

Figure 4:
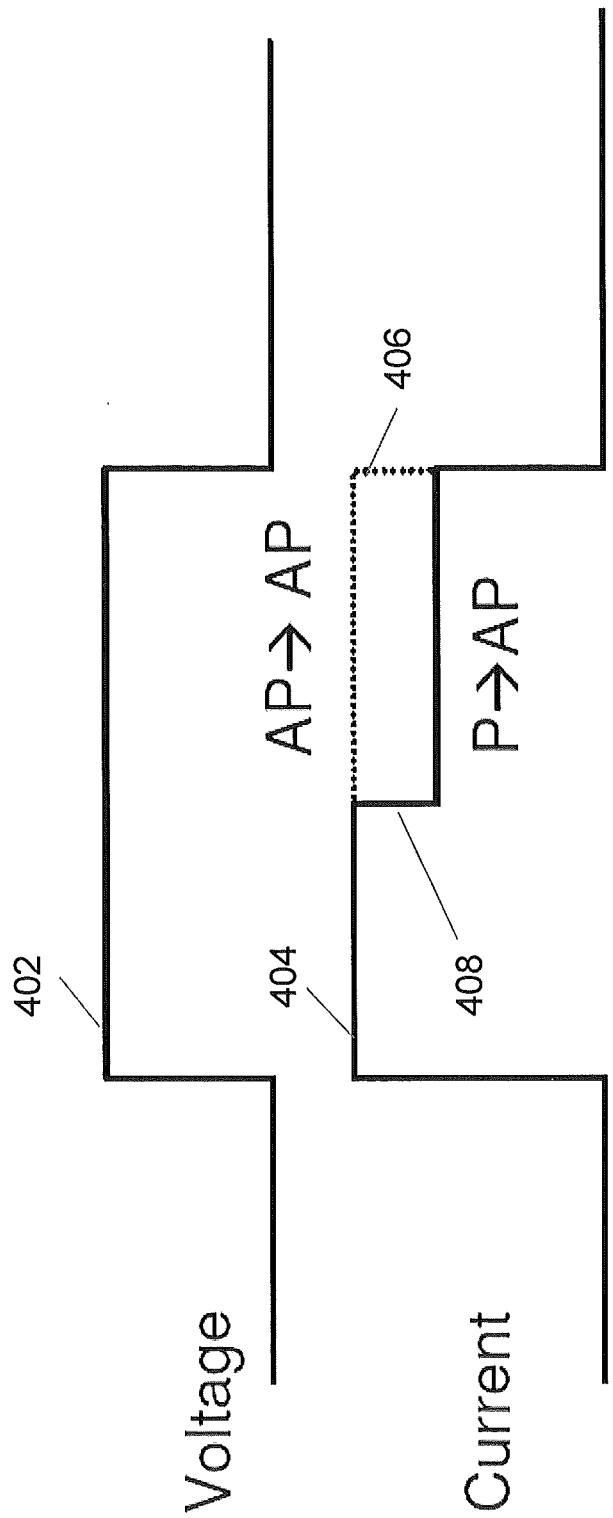
FIG. 4 is a graph illustrating application of an exemplary voltage pulse and a response to the voltage pulse in terms of current.

Turning to FIG. 4, a graph or waveform of a voltage 402 is shown. The voltage 402 may be generated by a source, such as the source 102 of FIG. 1. A polarity of the voltage 402 may be selected to bring an MTJ (e.g., MTJ 104 or 200) to an anti-parallel state. If the MTJ is in an anti-parallel (AP) state prior to the application of the pulse 402 to the MTJ, no switching may occur, and no drop in a current waveform 404 may be detected, as shown via the dashed line 406. On the other hand, if the MTJ is in a parallel (P) state prior to the application of the pulse 402 to the MTJ, a switching may occur, and a drop in the current waveform 404 may be detected, as shown via the transition or step 408. Thus, a detection of the presence or absence of the transition 408 may be used to determine the state of the MTJ prior to application of the pulsed voltage 402 to the MTJ.

Following application of the pulsed voltage 402 during a read operation, the original state of the MTJ (e.g., the state of the MTJ prior to application of the pulsed voltage 402) may need to be restored, such as when the MTJ changed state in response to the pulsed voltage 402. A logic circuit (not shown) may be used to determine which of one or more MTJs need to be restored. When error correction code (ECC) is incorporated into a memory device, ECC can be used to determine which bits need to be restored or reset. In the example of FIGS. 1 and 4, all MTJs may end up in an anti-parallel (AP) state. The read information, after going through ECC correction, may determine which bits need to be set back to a parallel (P) state. While the example of FIGS. 1 and 4 may switch every bits to the anti-parallel (AP) state, a circuit may be used to switch every bit into the parallel (P) state, and a transition may manifest itself as a jump or increase in current.

While FIG. 4 was described above in connection with the application of a pulsed voltage 402 and a monitoring or detection of a transition 408 or lack of transition 406 in terms of current, it is understood that different parameters may be used in some embodiments. For example, in some embodiments a pulsed current may be applied to the MTJ, and a voltage across the MTJ may be monitored for a change or transition.

While both read and write operations may use a pulse (e.g., a voltage pulse) to switch an MTJ, the pulse length and magnitude might not be the same for read and write operations. For example, a monitoring or sensing circuit (e.g., sensor 106 of FIG. 1) may need time to settle after a transient immediately after the turning on of the write voltage and/or write current. One way to accomplish this is to have a longer pulse length, and lower pulse amplitude, so that the transition is not likely to take place in the first couple of nanoseconds.

Figure 5:
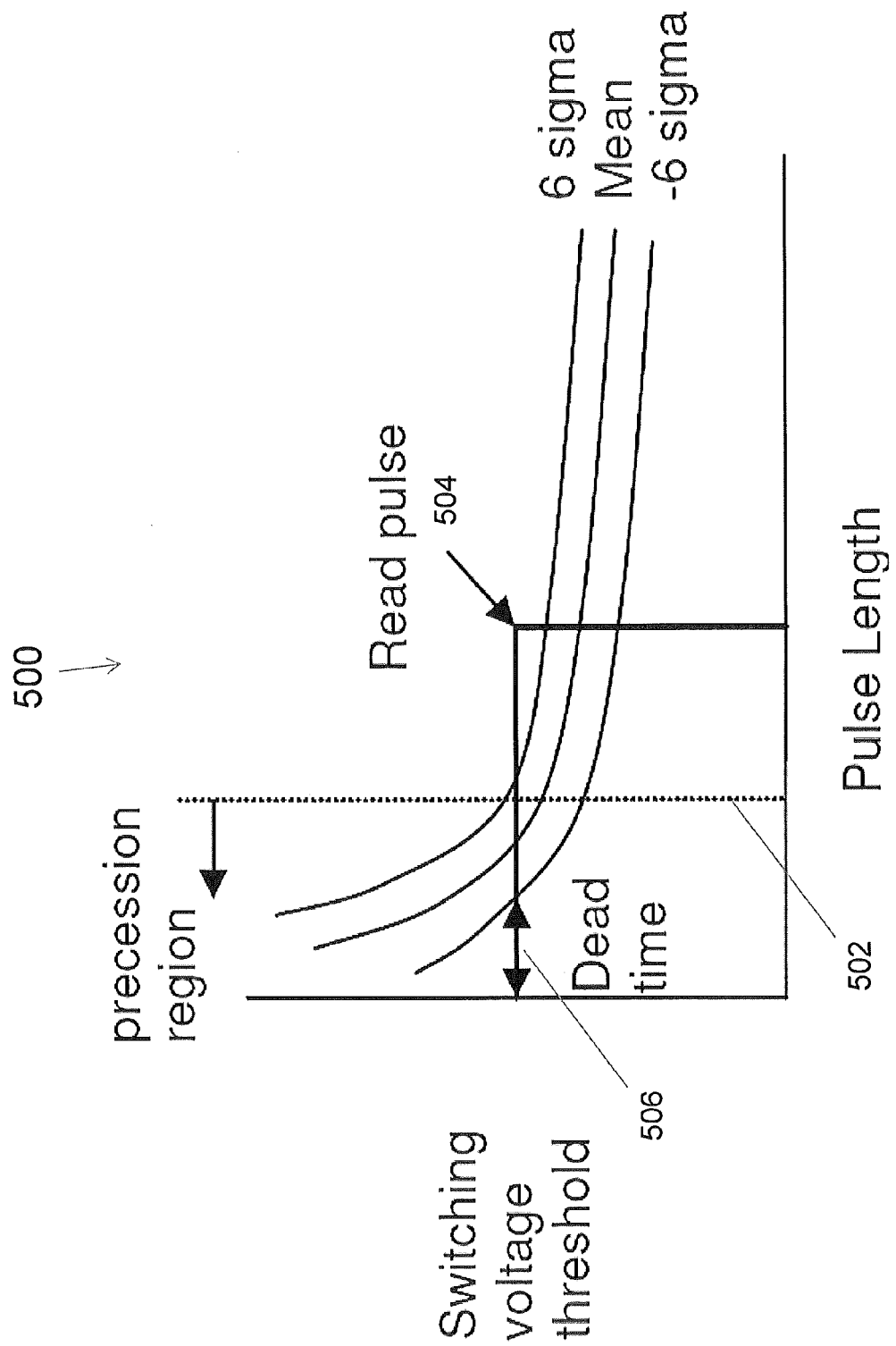
FIG. 5 is a graph illustrating an exemplary switching voltage threshold as a function of pulse length.

Turning to FIG. 5, a graph 500 illustrating an exemplary switching voltage threshold (e.g., switching threshold 304 of FIG. 3) as a function of pulse length for an MTJ is shown. As shown in FIG. 5, the threshold may increase dramatically as the pulse length is reduced below a certain value, such as approximately 10 nanoseconds (ns). This region is often described as the "precession region", which may correspond to pulse lengths less than (e.g., to the left of) the dashed line 502 in FIG. 5. There may be a distribution of the switching threshold at each pulse length, where such distribution may be reflected by the lines/parameters "mean", "6 sigma" and "−6 s sigma" in FIG. 5. In FIG. 5, a reasonable choice of a read pulse condition 504 is also denoted. The pulse length and pulse amplitude may be selected such that at the end of the pulse, a switching may be complete for the overall distribution of the MTJ all the time (e.g., under all conditions). At a chosen pulse amplitude, a dead time 506 is also denoted, during which time there might be no switching for all MTJs all the time (e.g., under all conditions). A sensing or monitoring device or circuit (e.g., sensor 106 of FIG. 1) may utilize the dead time 506 to settle down a transient, and get ready or prepare for a detection of transitions. Since a writing event might not require such a "dead time" 506, the writing condition or operation may be selected to have a shorter pulse length, and a corresponding higher voltage, so that a writing pulse may be shorter (e.g., substantially shorter) than a read pulse.

Figure 6:
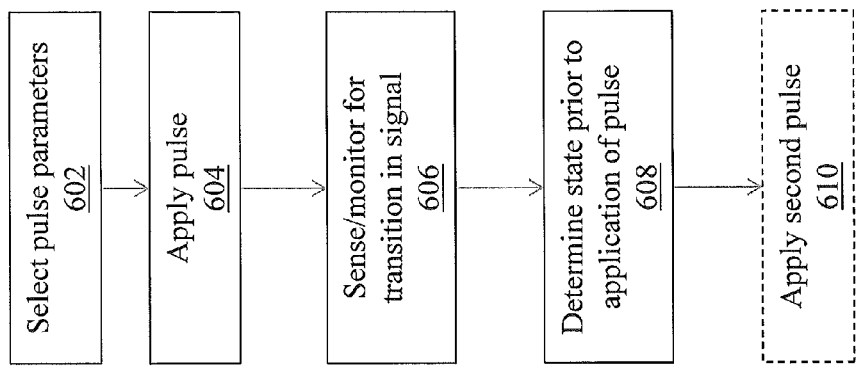
FIG. 6 is a flow chart of an exemplary method.

Turning to FIG. 6, a flow chart of an exemplary method is shown. The method may be executed in connection with one or more systems, components or devices, such as those described herein. The method may be used to detect a state (e.g., a magnetic state) of a memory cell or element or component thereof (e.g., an MTJ).

In block 602, parameters associated with a pulse may be selected. Such parameters may include a polarity, magnitude, and/or duration. The parameters may be selected to induce a switching in, e.g., an MTJ, if the original state of the MTJ is different from the polarity of the pulse. The pulse may correspond to a voltage pulse or a current pulse.

In block 604, the selected pulse of block 602 may be generated and applied to the MTJ.

In block 606, a sensing or monitoring for a transition in a signal may take place. For example, if the pulse applied to the MTJ in block 604 is a voltage pulse, then a sensing or monitoring of a current through the MTJ may occur in block 606. If the pulse applied to the MTJ in block 604 is a current pulse, then a sensing or monitoring of a voltage across the MTJ may occur in block 606.

In block 608, a state of the MTJ prior to the application of the pulse in block 604 may be determined based on the sensing/monitoring of block 606. For example, if the pulse polarity corresponds to an anti-parallel (AP) polarity/state, and no transition in the signal is detected in the block 606, then the state of the MTJ prior to the application of the pulse may be determined to be anti-parallel (AP). If the pulse polarity corresponds to an anti-parallel (AP) polarity/state, and a transition in the signal is detected in the block 606, then the state of the MTJ prior to the application of the pulse may be determined to be parallel (P). If the pulse polarity corresponds to a parallel (P) polarity/state, and no transition in the signal is detected in the block 606, then the state of the MTJ prior to the application of the pulse may be determined to be parallel (P). If the pulse polarity corresponds to a parallel (P) polarity/state, and a transition in the signal is detected in the block 606, then the state of the MTJ prior to the application of the pulse may be determined to be anti-parallel (AP).

In block 610, a second pulse may be applied to the MTJ. The second pulse may have a polarity that is opposite to the polarity of the pulse applied in block 604. The second pulse may be applied when the sensing/monitoring of block 606 indicates that a transition occurred. Block 610 may be used to restore an MTJ to an original state (e.g., to a state prior to the application of the pulse in block 604). In some embodiments, ECC logic may be applied to determine the original state of the MTJ. Block 610 might not execute if, e.g., no transition is detected in block 606.

The method of FIG. 6 is illustrative. In some embodiments, one or more of the block or operations (or a portion thereof) may be optional. In some embodiments, the operations may execute in an order or sequence different from what is shown. In some embodiments one or more additional operations not shown may be included.

Figure 7:
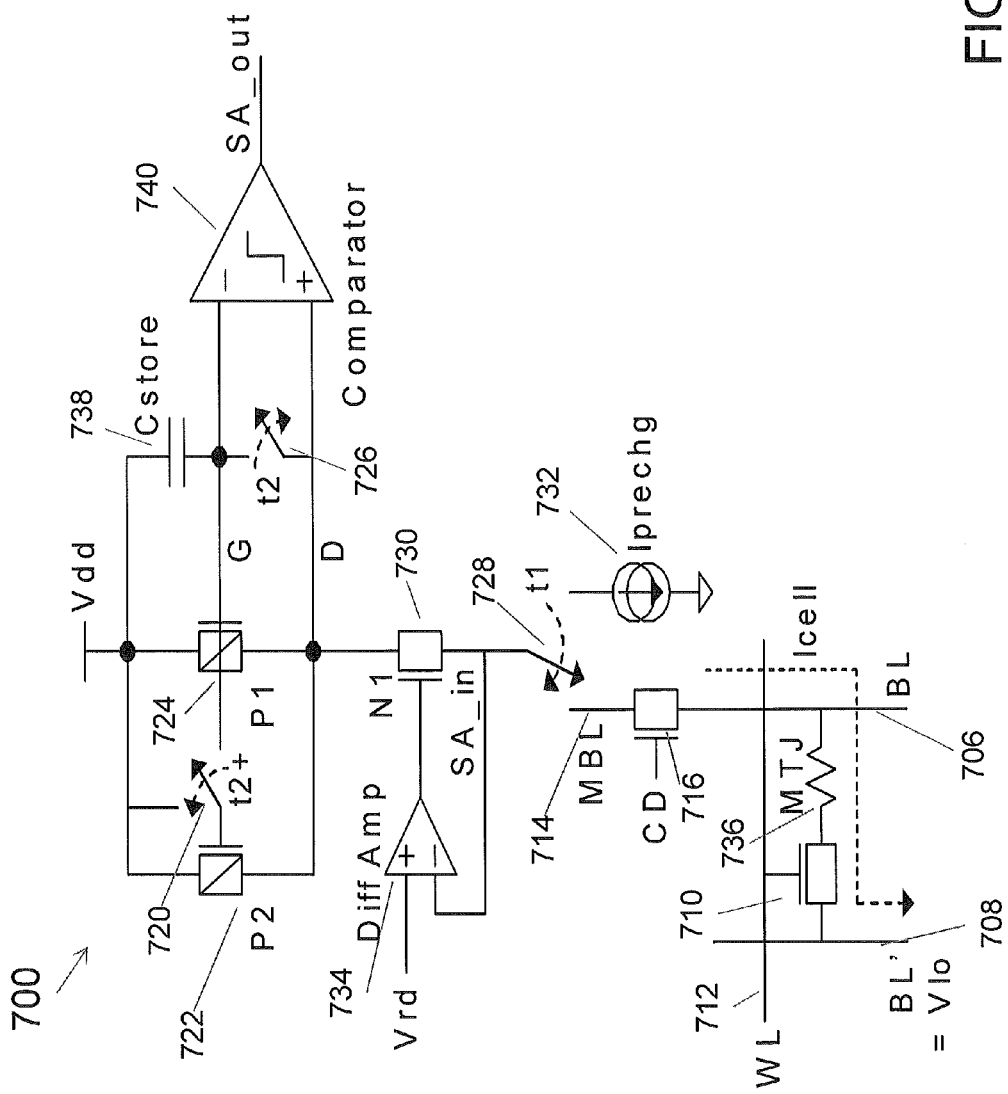
FIG. 7 is a schematic diagram illustrating an exemplary circuit.
Figure 8:
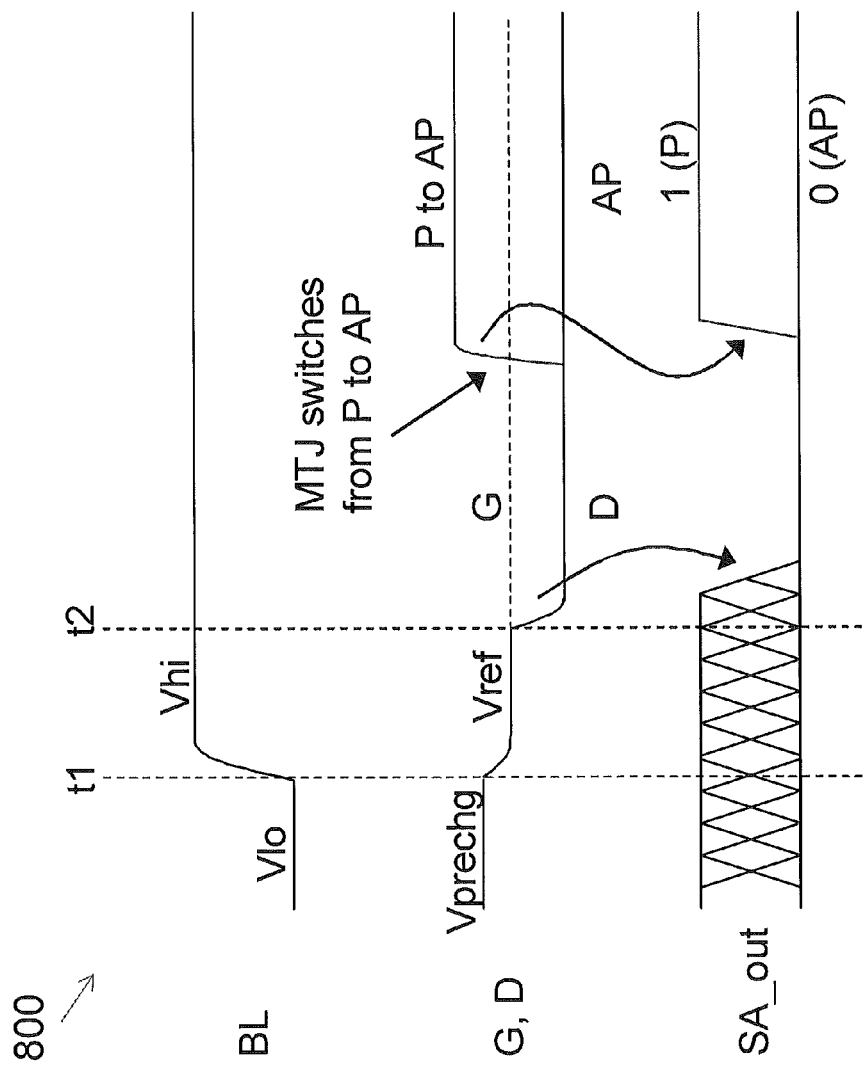
FIG. 8 is an exemplary timing diagram associated with the circuit of FIG. 7.

Turning now to FIGS. 7 and 8, an exemplary circuit 700 and timing diagram 800 in accordance with one or more embodiments are shown. In some embodiments, at least a portion of the circuit 700 may correspond to, or be included in, the sensor 106 of FIG. 1.

At the beginning of a read cycle and prior to time t1 in the timing diagram of FIG. 8, a number of items or tasks may need to be completed. A selected BL 706 (which, in some embodiments, may correspond to the BL 206 of FIG. 2) may be connected to a master BL (MBL) 714 by a column decoder (CD) device 716. The MBL 714 may be held at a low voltage (Vlo) via a holding device (not shown in FIG. 7). In some embodiments, Vlo may correspond to ground or a somewhat higher level. A selected BL' 708 (which, in some embodiments, may correspond to the BL' 208 of FIG. 2) also may be held at Vlo. A selected WL 712 (which may correspond to the WL 212 of FIG. 2 in some embodiments) may be driven high, which may enable an access transistor 710 (which may correspond to the transistor 210 of FIG. 2 in some embodiments). One or more switch devices 720 at a gate of a p-channel field effect transistor (PFET) P2 722 may be configured such that a PFET P1 724 and the PFET P2 722 share the same gate voltage. A switch device 726 between nodes G (gate) and D (drain) may be closed. One or more switch devices 728 at the source of an n-channel field effect transistor (NFET) N1 730 may be configured so as to connect a node SA_in to a current source Iprechg 732. The source 732 may be enabled and sink a current of similar magnitude to an expected value of a cell current, thus minimizing a transient which occurs later at time t1. The feedback loop formed by a differential amplifier (Diff Amp) 734 and the NFET N1 730 may be enabled, forcing the voltage at the node SA_in to a high voltage (Vhi). Vhi may be selected to be sufficiently higher than Vlo to ensure the switching of an MTJ 36 (which, in some embodiments, may correspond to the MTJ 104 of FIG. 1 and/or the MTJ 200 of FIG. 2) from the parallel (P) to the anti-parallel (AP) state within an allocated time. P1 724 and P2 722 may be arranged in parallel and the G and D nodes may be shorted together such that the two devices 724 and 722 appear as a single device in a "diode-connected" configuration. Iprechg 732 may then flow through devices P1 724 and P2 722. The nodes D and G may seek a level below a supply voltage (Vdd) by an amount related to Iprechg 732 and defined as Vprechg.

When all of the above items are completed and the circuit 700 has stabilized, at time t1, the device (not shown) holding the MBL 714 to Vlo may be disabled and the switch device(s) 728 at the source of NFET N1 730 may be reconfigured so as to connect the node SA_in to the MBL 714. The feedback loop may rapidly drive the MBL 714 and the BL 706 to Vhi, thus applying Vhi-Vlo across the BL 706-BL' 708 terminals of the cell and initializing the write pulse of the MTJ 736. The cell current (Icell) may then flow through the devices P1 724 and P2 722. Nodes D and G may seek a level below Vdd by an amount related to Icell and defined as Vref.

Some time later (e.g., a few nanoseconds later), at a time t2 chosen such that the circuit 700 may have stabilized but the MTJ 736 might not yet have switched, two events may occur in sequence. First, the switch device(s) 726 between the nodes G and D may be opened. A capacitor Cstore 738 may ensure that the node G remains at Vref. Next, at a time t2+ shortly after t2, the switch device(s) 720 at the gate of P2 722 may be reconfigured so as to connect the gate of P2 722 to Vdd, thus disabling P2 722. Since the feedback loop may continue to drive the BL 706 to Vhi and the MTJ 736 might not yet have switched states, Icell might not change. Since Icell and the voltage at the node G might not change, the voltage at the node D may fall in response to the disabling of P2 722. Since the voltage at the node D may fall below that at the node G, the output (SA_out) of the comparator 740 may be low.

If the MTJ 736 was previously in the anti-parallel (AP) state, the voltage applied across the cell (from BL 706 to BL' 708) might have no effect on the state of the MTJ 736 and SA_out may remain low for the remainder of the read cycle. If the MTJ 736 was previously in the parallel (P) state, the applied voltage may cause the MTJ 736 to switch to the anti-parallel (AP) state within the allocated time. Since the feedback loop may continue to drive the BL 706 to Vhi, Icell may decrease in response to the higher resistance anti-parallel (AP) state of the MTJ 736. The voltage at the D node may rise in response to the decrease in Icell, rising above the G node, and causing the output (SA_out) of the comparator 740 to go high.

The ratio of the widths of PFETs P2 722 and P1 724 may be carefully chosen in order to ensure a maximum read margin. To a first order, the ratio may be specified by the following equation:

$$Wp2/Wp1 \sim (Rap'-Rp')/(2*Rp'),$$

where Wp2 may correspond to the width of the PFET P2 722 and Wp1 may correspond to the width of the PFET P1 724, and where Rp' and Rap' may correspond to the parallel and anti-parallel resistances of the cell 736 including the array FET 710 and all parasitics and measured at bias conditions of BL 706=Vhi and BL'708=Vlo. In some embodiments, the ratio may be trimmed using, e.g., well-known techniques as part of a test sequence in order to maximize read margin.

Although not illustrated in FIG. 8, once the parallel (P) to anti-parallel (AP) switching event has been detected, the sense amplifier (SA) or a portion of the circuit 700 may be disabled and BLs (e.g., BL 706 and/or BL' 708) may be driven in the opposite polarity so as to restore the cell 736 to its original state (e.g., original parallel (P) state).

Embodiments may be used to reduce read access and cycle times. For example, by detecting an MTJ switching event during a write reference phase, read reference and read data phases may be reduced or eliminated.

Embodiments may be used to restore an MTJ to its original state (e.g., an original parallel (P) state) as soon as a switching from, e.g., a parallel (P) to an anti-parallel (AP) occurs. Such restoration may be based on a detection performed by a circuit (e.g., the circuit 700). Such restoration might not be possible using conventional techniques. Read cycle time may be reduced as a result of the restoration described herein.

Since the restore may begin immediately upon a switching from, e.g., parallel (P) to anti-parallel (AP) states, a free layer magnetic dipole might not have an opportunity to reach a stable position at an anti-parallel (AP) pole. For this reason, the restore may occur more rapidly, further reducing read cycle time.

The exemplary circuit 700 may be used to detect a parallel (P) to anti-parallel (AP) switching event. One skilled in the art would appreciate that the circuit 700 may be modified to enable a detection of an anti-parallel (AP) to parallel (P) switching event.

In some embodiments, a polarity of an MTJ write current may be determined by a free layer position (with respect to the fixed layer) as described below.

|  | Free layer on top | Free layer on bottom |
| --- | --- | --- |
| Write P | Current down | Current up |
| Write AP | Current up | Current down |

In FIG. 7, Icell (corresponding to Write AP) may flow through the MTJ 736 to the array FET 710 (corresponding to Current down), suggesting a "Free layer on bottom" configuration. In the case of a "Free layer on top" configuration, the BLs (e.g., BL 706 and/or BL' 708) may simply be swapped (e.g., SA connects to BL' 708).

In some embodiments, it may be assumed that the circuit 700 is able to reach a stable reference operating point (just before t2) prior to the first possible switching event. If this is not possible, the BL 706 voltage transition from Vlo to Vhi at time t1 may be applied in a ramped or decaying exponential manner as opposed to an abrupt step function manner. This more gradual application of the BL 706 voltage may delay the first possible switching event. Also, if this transition is sufficiently damped, the current flowing into the BL 706 might not overshoot its final value. In this case, the magnitude of the BL 706 current may decrease if the MTJ 736 switches from parallel (P) to anti-parallel (AP). Hence, the current flowing into the BL 706 may be monitored continuously from time t1 and any decrease may be interpreted as a switching event. Such an approach may be used to reduce the possibility of an error due to an early transition.

In some embodiments, an "active-read" circuit may be configured to detect, under a bias voltage above a switching threshold of an MTJ bit storing information or data, the presence or absence of a transition due to a change of the MTJ's magnetic state. The presence or absence of the transition may be detected using a variety of circuits.

In some embodiments, a pulse (e.g., a voltage or current pulse) may be applied to one or more MTJs. The applied pulse may provide for sufficient margin relative to a switching threshold, or a distribution of the switching threshold. The applied pulse may cause a transition that may be on the order of approximately half of an MTJ's resistance. In some embodiments, the transition may be on the order of, e.g., two hundred millivolts (200 mV), potentially with a well-defined turn-out threshold voltage and/or time. A detection of the presence or absence of this voltage may be used to determine the MTJ's bit state. Read operations may be performed relatively fast based on a relatively large signal level detection. In some embodiments, write-cycles may take on the order of five to twenty nanoseconds (5-20 ns).

Some embodiments may be tied to particular machines. For example, a stored state associated with a memory element or component may be determined by applying a pulse to the element/component using a source, and then monitoring via a monitoring device or sensor for the presence or absence of a switching event.

In some embodiments, various functions or acts may take place at a given location and/or in connection with the operation of one or more apparatuses or systems. In some embodiments, a portion of a given function or act may be performed at a first device or location, and the remainder of the function or act may be performed at one or more additional devices or locations.

As will be appreciated by one skilled in the art, embodiments may be implemented as a system, method or computer program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, embodiments may take the form of a computer program product embodied in one or more computer readable medium(s) having computer readable program code embodied thereon.

Any combination of one or more computer readable medium(s) may be utilized, such as one or more non-transitory computer readable mediums. The computer readable medium may be a computer readable storage medium. A computer readable storage medium may be, for example, but not limited to, an electronic, magnetic, optical, electromagnetic, infrared, or semiconductor system, apparatus, or device, or any suitable combination of the foregoing. More specific example (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There may be many variations to the diagram or the steps (or operations) described therein without departing from the spirit of the disclosure. For instance, the steps may be performed in a differing order or steps may be added, deleted or modified. All of these variations are considered a part of the disclosure.

It will be understood that those skilled in the art, both now and in the future, may make various improvements and enhancements which fall within the scope of the claims which follow.

What is claimed is:

1. A method for detecting a state of a memory element in a memory device, comprising:
    applying, during a read operation of the memory element, a voltage pulse of a predetermined magnitude and duration to the memory element that is sufficient to induce a transition in the state of the memory element when a polarity of the pulse is opposite to the state;
    monitoring, by a device, a current passing though the memory element as a result of the applied voltage pulse to detect a presence or absence of a transition in the current that initially passes through the memory element; and
    determining the state of the memory element based on said monitoring, wherein the presence of a transition in the current is detected by a drop in the current that initially passes through the memory element, and the absence of the transition in the current is detected by substantially no drop in the current that initially passes through the memory element.

2. The method of claim 1, wherein the memory device comprises a spin-transfer torque (STT) magnetic random access memory (MRAM) device, and wherein the memory element comprises a magnetic tunnel junction (MTJ).

3. The method of claim 1, further comprising:
    detecting the drop in current; and
    subsequent to determining the state of the memory element, applying a second voltage pulse to the memory element to restore the state of the memory element,
    wherein the second voltage pulse has a polarity that is opposite the polarity of the voltage pulse.

4. The method of claim 3, further comprising:
    subsequent to determining the state of the memory element, applying error correction code (ECC) logic to determine a state of each of a plurality of memory elements prior to having applied the voltage pulse to the plurality of memory elements.

5. The method of claim 1, further comprising:
    selecting the magnitude and duration of the voltage pulse such that subsequent to application of the voltage pulse to the memory element there exists a dead time during which no transition in the current occurs in order to provide a settling time to the device.

6. A system for detecting a state of a memory element in a memory device comprising:
    a source configured to generate and apply, during a read operation of the memory element, a voltage pulse of a predetermined magnitude and duration to the memory element that is sufficient to induce a transition in the state of the memory element when a polarity of the pulse is opposite to the state;

a device configured to monitor current passing though the memory element to detect a presence or absence of a transition in the current that initially passes through the memory element; and the device is configured to determine the state of the memory element based on the monitoring of the signal, wherein the presence of a transition in the current is detected by a drop in the current that initially passes through the memory element, and the absence of the transition in the current is detected by substantially no drop in the current that initially passes through the memory element.

7. The system of claim 6, wherein the device is configured to detect the drop in current, and wherein the source is configured to apply, subsequent to the device determining the drop in current, a second pulse to the memory element based on the device having detected the presence of the transition in the current to restore the state of the memory element, and wherein the second pulse has a polarity that is opposite the polarity of the pulse.

8. The system of claim 6, wherein the device comprises a differentiator configured to detect the presence or absence of the transition in the current.

9. A system for detecting a state of a magnetic tunnel junction (MTJ) in a memory device, comprising:

a source configured to generate and apply a pulse of a predetermined magnitude and duration to the MTJ to induce a transition in the state of the MTJ when a polarity of the pulse is opposite to the state;

a device configured to monitor a signal associated with the MTJ to detect a presence or absence of a transition in the signal; and the device is configured to determine the state of the memory element based on the monitoring of the signal, the device further comprising:

a column decoder (CD) device coupled to the MTJ, a first field effect transistor (FET) coupled to the CD device, a differential amplifier coupled to the first FET to form a feedback loop, a second FET coupled to the first FET, a third FET coupled to the first FET, a capacitor coupled to the second FET and selectively coupled to the first FET, and a comparator coupled to the second FET, the capacitor, and the first FET, wherein an output of the comparator provides an indication of the presence or absence of the transition in the signal.

10. The system of claim 9, wherein the first FET comprises an n-channel FET, and wherein the second FET comprises a p-channel FET, and wherein the third FET comprises a second p-channel FET.

11. The system of claim 9, wherein a gate of the third FET is selectively coupled to a gate of the second FET.

* * * * *